United States Patent

Shimura et al.

Patent Number: 5,234,796
Date of Patent: Aug. 10, 1993

[54] METHOD OF DEVELOPING PRESENSITIZED OFFSET PRINTING PLATES AND DEVELOPING SOLUTION USED IN THAT METHOD

[75] Inventors: Kazuhiro Shimura; Masafumi Uehara; Akira Nogami; Shinya Watanabe, all of Hino, Japan

[73] Assignee: Konica Corporation, Tokyo, Japan

[21] Appl. No.: 727,110

[22] Filed: Jul. 9, 1991

[30] Foreign Application Priority Data

Jul. 11, 1990 [JP] Japan ................... 2-183369

[51] Int. Cl.$^5$ ............................... G03C 5/00
[52] U.S. Cl. ................... 430/331; 430/302; 430/309; 430/325
[58] Field of Search ............ 430/331, 309, 302, 325; 252/548, 529

[56] References Cited

U.S. PATENT DOCUMENTS

| | | | |
|---|---|---|---|
| 4,530,895 | 7/1985 | Simon et al. | 430/145 |
| 4,579,811 | 4/1986 | Schell et al. | 430/331 |
| 5,106,724 | 4/1992 | Nogami et al. | 430/309 |

FOREIGN PATENT DOCUMENTS

| | | |
|---|---|---|
| 0101010 | 2/1984 | European Pat. Off. |
| 0279630 | 8/1988 | European Pat. Off. |
| 3800359 | 7/1988 | Fed. Rep. of Germany |
| 62-159148 | 7/1987 | Japan ............... 430/302 |

OTHER PUBLICATIONS

Patent Abstracts of Japan, vol. 11, No. 395 (P-650) (2482) Dec. 24, 1987. "Developing Solution Composition for Photosensitive Lithographic Plate and Developing Method".

*Primary Examiner*—Marion E. McCamish
*Assistant Examiner*—Janis L. Dote
*Attorney, Agent, or Firm*—Finnegan, Henderson, Farabow, Garrett & Dunner

[57] ABSTRACT

A developing solution of an imagewise exposed, presensitized offset printing plate is disclosed. The developing solution has a pH of at least 12.5, and contains a low content of a silicate in an amount of up to 1.0 wt % as $SiO_2$, a surfactant in an amount of 0.01 to 10 wt %, an aromatic carboxylic acid in an amount of 0.1 to 10 wt %, and an amine compound represented by the following general formula (I) in an amount of 0.1 to 10 wt %:

$$R_1-N(R_2)-J-OH \qquad (I)$$

wherein $R_1$ and $R_2$ are each independently a hydrogen atom, a group $-C_2H_4OH$ or a group $-C_3H_6OH$; and J is a group $-C_2H_4-$ or $-C_3H_6-$.

7 Claims, 2 Drawing Sheets

METHOD OF DEVELOPING PRESENSITIZED OFFSET PRINTING PLATES AND DEVELOPING SOLUTION USED IN THAT METHOD

BACKGROUND OF THE INVENTION

This invention relates to a method of developing presensitized offset printing plates and a developing solution used in that method.

Aluminum plates are commonly used as supports for presensitized offset printing plates. Since alkaline solutions having high pHs are used to develop presensitized offset printing plates, the surface of the aluminum plate that becomes exposed in areas from which the light-sensitive layer has been removed tends to be corroded by alkaline developing solutions to impair the hydrophilic nature of the non-image areas, thereby increasing the chance of fouling of the print. Another problem with the corroded aluminum plate is sludge formation, which can either foul the automatic processor or cause sludge deposition on the printing plate being developed. These phenomena are particularly noticeable when using a developing solution that contains a silicate in a small amount ($\leq 1.0$ wt % as $SiO_2$) and that has a pH of at least 12.5.

As a method for preventing the corrosion of aluminum supports by alkaline developing solutions, Unexamined Published Japanese Patent Application No. 59444/1983 teaches the use of an alkaline developing solution that contains both sodium metasilicate and an inorganic lithium compound. Unexamined Published Japanese Patent Application No. 25100/1980 proposes that an ionizable compound of an element of the group IIa, IIIa or IIIb of the periodic table be added to the developing solution. However, neither of these methods are completely satisfactory for the purpose of preventing the corrosion of aluminum supports.

SUMMARY OF THE INVENTION

An object, therefore, of the present invention is to provide a method by which presensitized offset printing plates can be processed with a developing solution that has a low content of silicate (as $SiO_2$) and a high pH in such a way that the corrosion of the aluminum support is sufficiently prevented to retain the hydrophilic nature of the non-image areas, thereby effectively preventing the formation of sludge in the developing solution which would otherwise occur if the aluminum support were corroded.

Another object of the present invention is to provide a developing solution that is suitable for use in implementing that method.

The first object of the present invention can be attained by a method of developing an imagewise exposed, presensitized offset printing plate with a developing solution having a pH of at least 12.5, wherein the developing solution contains a silicate in an amount of up to 1.0 wt % as $SiO_2$, a surfactant in an amount of 0.01 to 10 wt %, an aromatic carboxylic acid in an amount of 0.1 to 10 wt %, and an amine compound represented by the following general formula (I) in an amount of 0.1 to 10 wt %:

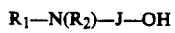

$$R_1-N(R_2)-J-OH \qquad (I)$$

where $R_1$ and $R_2$ are each independently a hydrogen atom, a group $-C_2H_4OH$ or a group $-C_3H_6OH$; and J is a group $-C_2H_4-$ or a group $-C_3H_6-$.

The second object of the present invention can be attained by a developing solution having a pH of 12.5 to 13.5, and containing a silicate in an amount of up to 1.0 wt % as $SiO_2$, a surfactant in an amount of 0.01 to 10 wt %, an aromatic carboxylic acid in an amount of 0.1 to 10 wt %, and an amine compound represented by the general formula (I) in an amount of 0.1 to 10 wt %.

DETAILED DESCRIPTION OF THE INVENTION

Figure 1:
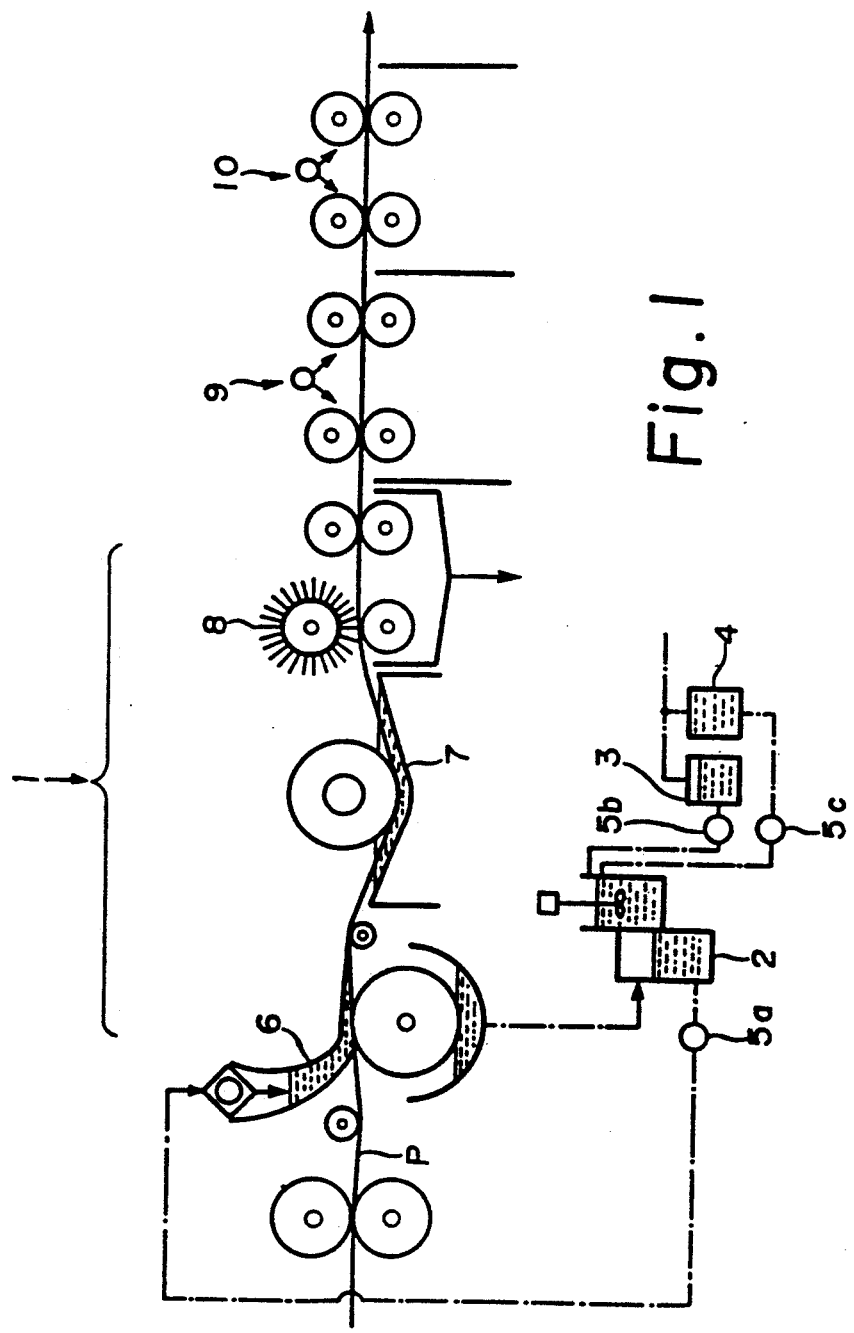
FIG. 1 is a schematic diagram of the automatic processor used in Example 2 and Comparative Example 2.

The alkanolamine which is represented by the general formula (I) and which is to be contained in the developing solution of the present invention is preferably monoethanolamine, diethanolamine, triethanolamine, monopropanolamine, dipropanolamine or tripropanolamine, with triethanolamine being particularly preferred.

If the content of the compound represented by the general formula (I) is less than 0.1 wt %, it is not fully effective in preventing the corrosion of aluminum supports. On the other hand, if the content of the compound exceeds 10 wt %, the thickness of the light-sensitive layer that should be left intact as image in presensitized offset printing plates, particularly in positive-acting plates will unduly decrease. Further, when lines are drawn with a ball-point pen as is often the case in platemaking operations, the light-sensitive layer which should remain as image will be lost from the scratched area during subsequent development.

The developing solution of the present invention contains a silicate in an amount of up to 1.0 wt % as calculated for $SiO_2$. Preferred examples of the silicate are salts of silicic acid with alkali metals such as potassium, sodium and lithium, with a potassium salt being particularly preferred.

The developing solution of the present invention will prove particularly effective at pHs of 12.5 and above. The upper limit of pH is not set at any specific values, but for practical purposes, it is usually 13.5.

In addition to the silicate, the developing solution of the present invention may also contain alkali agents which are inorganic or organic. Exemplary inorganic alkali agents include potassium hydroxide, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate and ammonium carbonate. Exemplary organic alkali agents include mono-, di- and triethanolamines, tetraalkyl hydroxides.

Alkali agents that are preferably used in the present invention include potassium hydroxide, sodium hydroxide, lithium hydroxide, a phosphoric acid salt (e.g. potassium phosphate, sodium phosphate and lithium phosphate) and a carbonic acid salt (e.g. potassium carbonate, sodium carbonate and lithium carbonate).

Besides the components described above, the developing solution of the present invention preferably contain surfactants. The preferred surfactant is at least one member selected from the group consisting of anionic, nonionic and cationic surfactants.

Exemplary anionic surfactants include: salts of higher alcohol ($C_{8-22}$) sulfate esters (e.g. sodium salt of laurylalcohol sulfate, sodium salt of octylalcohol sulfate, ammonium salt of laurylalcohol sulfate, Teepol-81 (trade name of Shell Chemical Co.) and disodium alkyl sulfate); salts of aliphatic alcohol phosphate esters (e.g. sodium salt of cetylalcohol phosphate ester); salts of alkylarylsulfonic acids (e.g. sodium salt of dodecylbenzenesulfonic acid, sodium salt of isopropylnaphthalenesulfonic acid, sodium salt of dinaphthalenedisulfonic acid and sodium salt of metanitrobenzenesulfonic acid); sulfonic acid salts of alkylamides (e.g. $C_{17}H_{33}CON(CH_3)$—$CH_2SO_3Na$); and sulfonic acid salts of dibasic aliphatic acid esters (e.g. sodium dioctyl sulfosuccinate and dihexyl sodium sulfosuccinate). Among these, sulfonic acid salts are used with particular advantage.

Nonionic surfactants are available in two types, polyethylene glycol type and polyhydric alcohol type, and either type can be used in the present invention. From the viewpoint of developing performance, nonionic surfactants of the polyethylene glycol type are preferred, and among them those which have at least three ethyleneoxy groups (—$CH_2CH_2O$—) and which have a hydrophilic-lipophilic balance (HLB) of at least 5 (more preferably 8-20) are more preferred.

Nonionic surfactants having both an ethyleneoxy group and a propyleneoxy group are particularly preferred and those which have a HLB value of at least 8 are most preferred.

Preferred nonionic surfactants are those listed below which are represented by general formula (1)-(8):

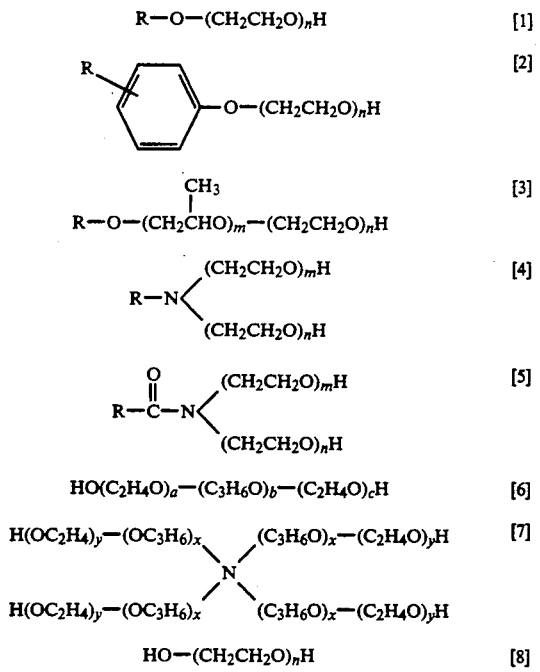

where R is a hydrogen atom or a monovalent organic group; exemplary organic groups include straight or branched $C_{1-30}$ alkyl groups optionally having substituents (e.g. an aryl group such as phenyl), alkylcarbonyl groups the alkyl moiety of which comprises the alkyl groups defined above, and phenyl groups optionally having substituents (e.g. a hydroxyl group and the alkyl groups defined above); and a, b, c, m, n, x and y are each an integer of 1-40.

Specific examples of the nonionic surfactants are listed below: polyethylene glycol, polyoxyethylene lauryl ether, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, oxyethyleneoxypropylene block copolymer, distyrenated phenol polyethylene oxide adduct, tribenzyl phenol polyethylene oxide adduct, octyl phenol polyoxyethylene polyoxypropylene adduct, glycerol monostearate, sorbitan monolaurate, and polyoxyethylene sorbitan monolaurate.

These nonionic surfactants preferably have weight average molecular weights of 300-10,000, with the range of 500-5,000 being particularly preferred. The nonionic surfactants may be contained either individually or as admixtures.

Cationic surfactants are roughly divided into two types, amine type and quaternary ammonium salt type, and either type can be used in the present invention.

Exemplary amine-type cationic surfactants include polyoxyethylene alkylamine, N-alkylpropyleneamine, N-alkylpolyethylene polyamine, N-alkylpolyethylene polyamine dimethylsulfuric acid salts, alkyl biguanide, long-chain amine oxides, alkylimidazoline, 1-hydroxyethyl-2-alkylimidazoline, 1-acetylaminoethyl-2-alkylimidazoline, and 2-alkyl-4-methyl-4-hydroxymethyl oxazoline.

Exemplary cationic surfactants of the quaternary ammonium salt type include long-chain primary amine salts, alkyltrimethyl ammonium salts, dialkyldimethylethyl ammonium salts, alkyldimethyl ammonium salts, alkyldimethylbenzyl ammonium salts, alkylpyridinium salts, alkylquinolinium salts, alkylisoquinolinium salts, alkylpyridinium sulfate salts, stearamidomethylpyridinium salt, acylaminoethyldiethylamine salt, acylaminoethylmethyldiethyl ammonium salt, alkylamidopropyldimethylbenzyl ammonium salts, aliphatic acid polyethylene polyamides, acylaminoethylpyridinium salt, acylcoraminoformylmethylpyridinium salt, stearoxymethylpyridinium salt, aliphatic acid triethanolamine, aliphatic acid triethanolamine formic acid salt, trioxyethylene aliphatic acid triethanolamine, aliphatic acid dibutylaminoethanol, cetyloxymethylpyridinium salt, and p-isooctylphenoxyethoxyethyldimethylbenzyl ammonium salt. The term "alkyl" as it appears in the compounds listed above means straight or partially substituted alkyl groups having 6-20 carbon atoms and, stated more specifically, straight alkyls such as hexyl, octyl, cetyl and stearyl are preferably used.

Among these compounds, water-soluble cationic surfactants of the quaternary ammonium salt type are particularly effective, with alkyltrimethyl ammonium salts, alkyldimethylbenzyl ammonium salts and ethylene oxide added ammonium salts being particularly advantageous. In the broad sense of the term, cationic surfactants cover those polymers which have cation components as recurring units and such polymers are also included within the scope of cationic surfactants that can be used in the present invention. Polymers containing quaternary ammonium salts that are prepared by copolymerization with oleophilic monomers may be used with particular advantage.

Those polymers preferably have weight average molecular weights of 300-50,000, with the range of 500-5,000 being particularly preferred. The cationic surfactants listed above may be used either individually or as admixtures.

The surfactants are preferably contained in the developing solution of the present invention in amounts of 0.01-10 wt%.

The aromatic carboxylic acids of the invention include the compounds having a benzene ring, a naphthalene ring or an anthracene ring substituted with a carboxyl group. The typical examples of the compounds include benzoic acid, o-chlorobenzoic acid, p-o-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, p-tert-butylbenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid. The above-given aromatic carboxylic acids may be used in the form of the sodium, potassium or ammonium salts thereof so that the water-solubility thereof can be enhanced.

The aromatic carboxylic acids or salts thereof should be added into the developing solution of the present invention, in an amount of 0.1 wt % to 10 wt % and, preferably, 0.5 wt % to 4 wt %.

The developing solution of the present invention may also contain organic solvents, inorganic reducing agents, chelating agents, etc.

Exemplary organic solvents are those which have a water solubility of no more than 10 wt % at 20° C. and include: carboxylic acid esters such as ethyl acetate, propyl acetate, butyl acetate, benzyl acetate, ethylene glycol monobutyl acetate, butyl lactate, and butyl levulinate; ketones such as ethyl butyl ketone, methyl isobutyl ketone, and cyclohexanone; alcohols such as ethylene glycol monobutyl ether, ethylene glycol benzyl ether, ethylene glycol monophenyl ether, benzyl alcohol, methyl phenyl carbinol, n-amyl alcohol, and methylamine alcohol; alkyl-substituted aromatic hydrocarbons such as xylene; and halogenated hydrocarbons such as methylene dichloride, ethylene dichloride and monochlorobenzene. These organic solvents may be used either individually or as admixtures. The organic solvents may be contained in the developing solution in amounts of 0.05-10 wt %.

Exemplary inorganic reducing agents include: sulfites such as sodium sulfite, potassium sulfite, ammonium sulfite, sodium hydrogen sulfite and potassium hydrogen sulfite; phosphites such as sodium phosphite, potassium phosphite, sodium hydrogen phosphite, potassium hydrogen phosphite, sodium dihydrogen phosphite and potassium dihydrogen phosphite; as well as hydrazine, sodium thiosulfate and sodium dithionite. These inorganic reducing agents may be contained in the developing solution in amounts of 0.1-20 wt %.

Exemplary chelating agents include EDTA and NTA of the types described in Unexamined Published Japanese Patent Application No. 75152/1983.

The developing solution of the present invention may also contain the following additives: neutral salts such as NaCl, KCl and KBr, as described in Unexamined Published Japanese Patent Application No. 75152/1983; complexes such as $[Co(NH_3)_6]Cl_3$, as described in Unexamined Published Japanese Patent Application No. 121336/1984; amphoteric polymer electrolytes such as the copolymer of vinylbenzyltrimethyl ammonium chloride and sodium acrylate, as described in Unexamined Published Japanese Patent Application No. 142528/1981; inorganic lithium compounds such as lithium chloride, as described in Unexamined Published Japanese Patent Application No. 59444/1983; organic lithium compounds such as lithium benzoate, as described in Japanese Patent Publication No. 34442/1975; organometallic surfactants containing Si, Ti, etc., as described in Unexamined Published Japanese Patent Application No. 84241/1984.

In the method of the present invention, development is preferably performed at a temperature of 20°-40° C. for a period of 5-40 seconds.

The presensitized offset printing plates which can be processed by the method of the present invention are those which are developed with alkaline developing solutions and which can potentially experience corrosion in aluminum supports. Examples of such printing plates are those which comprise anodized aluminum supports having thereon a photosensitive layer that use an o-quinonediazide compound or a diazo compound as a light-sensitive component. More specific examples are presensitized offset printing plates of the type described in Unexamined Published Japanese Patent Application No. 175757/1987, page 5, lower left column, line 18 to page 7, upper right column, line 11, and presensitized offset printing plates of such a type that a toner image is formed on a photoconductive layer provided on an anodized aluminum support, with the photoconductive layer in non-image areas being developed with an alkaline developing solution.

The following examples are provided for the purpose of further illustrating the present invention but are in no way to be taken as limiting.

EXAMPLE 1

Developing solution A (for its recipe, see below) was set in an automatic processor (Model PSK-910 of Konica Corp.) and a positive film was placed in contact with 100 PS plates (SHP-N of Konica Corp. with a size of 1003 mm × 800 mm). After 60 sec exposure to a 2-kW metal halide lamp 70 cm distant at an energy of 8.0 $kW/m^2$, each of the PS plates was developed at 27° C. for 20 seconds.

| Developing solution A | Parts by weight |
| --- | --- |
| Water | 88.25 |
| Benzoic acid | 1.03 |
| Nonionic surfactant (Emalgen 147 of Kao Corp.) | 0.04 |
| Potassium silicate A (trade name of Nippon Kagaku K.K.: 27% $SiO_2$ and 13.5% $K_2O$) | 2.58 |
| Potassium carbonate | 1.03 |
| KOH (50% aq. sol.) | 3.07 |

| Developing solution A | Parts by weight |
|---|---|
| Diethanolamine | 3.00 |
| (SiO$_2$ content: 0.704 wt %; pH, 12.89) | |

EXAMPLE 2

Using developing solution B (for its recipe, see below), an experiment was conducted as in Example 1 with an automatic processor of the type shown in FIG. 1. The automatic processor shown in FIG. 1 comprised: a developing unit 1, a tank 2 of developing solution, a tank 3 of concentrated developing solution, a tank 4 of diluent water, feed pumps 5a–5c, a means 6 of supplying the developing solution, a development tank 7, a brush roller 8, a washing unit 9, and a gumming unit 10. Shown by P is a presensitized offset printing plate. The feed rates of pumps 5b and 5c were set at such values that the concentrated developing solution would be diluted 6 folds with diluent water.

| Developing solution (concentrated) | Parts by weight |
|---|---|
| Water | 21.64 |
| β-Anilinoethanol | 0.30 |
| Propylene glycol | 2.52 |
| p-t-Butylbenzoic acid | 7.80 |
| 50% KOH | 21.48 |
| Emalgen 147 | 0.24 |
| Potassium silicate A | 18.60 |
| Potassium sulfite | 15.42 |
| Triethanolamine | 12.00 |
| [SiO$_2$ content of 6-fold diluted solution (working solution): 0.837 wt %; pH, 13.00] | |

EXAMPLE 3

Figure 2:
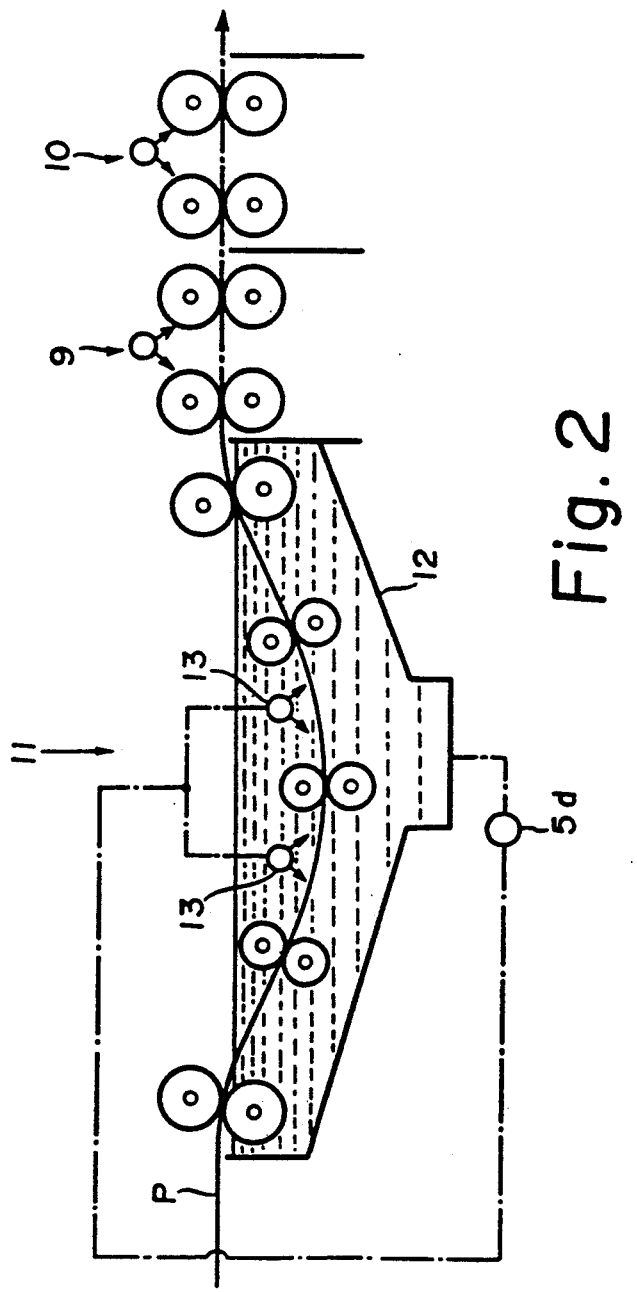
FIG. 2 is a schematic diagram of the automatic processor used in Example 3 and Comparative Example 3.

Using developing solution C (for its recipe, see below), an experiment was conducted as in Example 1 with an automatic processor of the type shown in FIG. 2. The automatic processor shown in FIG. 2 comprised: a developing unit 11, a tank 12 of developing solution, nozzles 13, a washing unit 9, a gumming unit 10, and a feed pump 5d. Shown by P is a presensitized offset printing plate.

| Developing solution C | Parts by weight |
|---|---|
| Water | 88.42 |
| β-Anilinoethanol | 0.02 |
| Propylene glycol | 2.00 |
| p-t-Butylbenzoic acid | 1.08 |
| KOH (50% aq. sol.) | 2.33 |
| Emalgen 147 | 0.04 |
| Potassium silicate A | 2.01 |
| Potassium sulfite | 2.10 |
| Triethanolamine | 2.00 |
| (SiO$_2$ content: 0.543 wt %; pH, 12.90) | |

COMPARATIVE EXAMPLE 1

An experiment was conducted as in Example 1 except that developing solution A was replaced by developing solution D having the recipe shown below.

| Developing solution D | Parts by weight |
|---|---|
| Water | 91.25 |
| Benzoic acid | 1.03 |
| Emalgen 147 | 0.04 |
| Potassium silicate A | 2.58 |
| Potassium carbonate | 1.03 |
| KOH (50% aq. sol.) | 3.07 |
| (SiO$_2$ content: 0.704 wt %; pH, 12.90) | |

COMPARATIVE EXAMPLE 2

An experiment was conducted as in Example 2 except that developing solution B was replaced by developing solution E having the recipe shown below.

| Developing solution E (concentrated) | Parts by weight |
|---|---|
| Water | 33.64 |
| β-Anilinoethanol | 0.30 |
| Propylene glycol | 2.52 |
| p-t-Butylbenzoic acid | 7.80 |
| 50% KOH | 21.48 |
| Emalgen 147 | 0.24 |
| Potassium silicate A | 18.60 |
| Potassium sulfite | 15.42 |
| [SiO$_2$ content of 6-fold diluted solution (working solution): 0.837 wt %; pH, 13.01] | |

COMPARATIVE EXAMPLE 3

An experiment was conducted as in Example 3 except that developing solution C was replaced by developing solution F having the recipe shown below.

| Developing solution F | Parts by weight |
|---|---|
| Water | 90.42 |
| β-Anilinoethanol | 0.02 |
| Propylene glycol | 2.00 |
| p-t-Butylbenzoic acid | 1.08 |
| 50% KOH | 2.33 |
| Emalgen 147 | 0.04 |
| Potassium silicate A | 2.01 |
| Potassium sulfite | 2.10 |
| (SiO$_2$ content: 0.543 wt %; pH, 12.92) | |

The amount of aluminum that dissolved into the developing solutions as a result of corrosion of the aluminum supports in Examples 1–3 and Comparative Examples 1–3 was determined from a calibration curve that was constructed by measuring aluminum fluorescent X-rays with a wave dispersive fluorescent X-ray meter (WDX). Each of the developing solutions was put into a 1-L sample bottle for 10 days and stored under an airtight condition. The amount of precipitate that formed as a result of this storage was checked visually. The results are shown in Table 1 below.

TABLE 1

| Run | Developing solution | pH | Dissolved Al (ppm) | Precipitate |
|---|---|---|---|---|
| Example 1 | A | 12.89 | 150 | ○ |
| 2 | B | 13.00 | 260 | ○△ |
| 3 | C | 12.90 | 105 | ○ |
| Comparative | | | | |
| Example 1 | D | 12.90 | 350 | △ |
| 2 | E | 13.01 | 520 | X |

TABLE 1-continued

| Run | Developing solution | pH | Dissolved Al (ppm) | Precipitate |
|---|---|---|---|---|
| 3 | F | 12.92 | 310 | ΔX |

Key to the symbols:
○ ... No precipitate formed on the bottom of the tank containing the recovered exhausted solution.
Δ ... A thin layer of precipitate formed on the bottom of the tank containing the recovered exhausted solution.
X ... Much precipitate formed on the bottom of the tank containing the recovered exhausted solution.
○Δ ... Intermediate between ○ and Δ.
ΔX ... Intermediate between Δ and X.

As in clear from Table 1, the developing solutions used in Examples 1-3 which incorporated amines of the general formula (I) in accordance with the present invention contained smaller amounts of aluminum and hence caused less precipitate to form.

The present invention thus provides a method by which presensitized offset printing plates can be processed with a developing solution that has a low content of silicate (as SiO₂) and a high pH in such a way that the corrosion of the aluminum support is sufficiently inhibited to retain the hydrophilic nature of the non-image areas, thereby effectively inhibiting the formation of sludge which would otherwise occur if the aluminum support were corroded. The present invention also provides a developing solution suitable for use in implementing that method.

What is claimed is:

1. A developing solution for developing an imagewise exposed, presensitized offset printing plate, the developing solution having a pH of 12.5 to 13.5, and containing a low content of a silicate in an amount of up to 1.0 wt % as SiO₂, a surfactant in an amount of 0.01 to 10 wt %, an aromatic carboxylic acid in an amount of 0.1 to 10 wt %, and an amine compound represented by the following general formula (I) in an amount of 0.1 to 10 wt %:

$$R_1-N(R_2)-J-OH \qquad (I)$$

wherein $R_1$ and $R_2$ are each independently a hydrogen atom, a group $-C_2H_4OH$ or a group $-C_3H_6OH$; and J is a group $-C_2H_4-$ or a group $-C_3H_6-$.

2. A developing solution according to claim 1 wherein the amine represented by the general formula (I) is a member selected from the group consisting of monoethanolamine, diethanolamine, triethanolamine, monopropanolamine, dipropanolamine and tripropanolamine.

3. A developing solution according to claim 1 wherein said silicate is a member selected from the group consisting of potassium silicate, sodium silicate and lithium silicate.

4. A developing solution according to claim 1 which contains an inorganic alkali agent selected from the group consisting of potassium hydroxide, sodium hydroxide, lithium hydroxide, a phosphoric acid salt and a carbonic acid salt.

5. A developing solution according to claim 4 which contains 0.01-10 wt % of a surfactant selected from the group consisting of an anionic surfactant, a nonionic surfactant and a cationic surfactant.

6. A developing solution according to claim 5 wherein said anionic surfactant is a sulfonic acid salt, said nonionic surfactant is a polyethylene glycol which contains at least three ethyleneoxy groups ($-CH_2CH_2O-$) and has a HLB of at least 5, and said cationic surfactant is a water-soluble quaternary ammonium salt.

7. A developing solution according to claim 1 which further contains 0.05-10 wt % of an organic solvent, 0.1-20 wt % of a reducing agent, and a chelating agent.

* * * * *